United States Patent
Han

(10) Patent No.: US 9,672,884 B1
(45) Date of Patent: Jun. 6, 2017

(54) SEMICONDUCTOR DEVICES AND SEMICONDUCTOR SYSTEMS INCLUDING THE SAME

(71) Applicant: SK hynix Inc., Icheon-si Gyeonggi-do (KR)

(72) Inventor: Min Sik Han, Icheon-si (KR)

(73) Assignee: SK hynix Inc., Icheon-si (KR)

(*) Notice: Subject to any disclaimer, the term of this patent is extended or adjusted under 35 U.S.C. 154(b) by 0 days.

(21) Appl. No.: 15/219,529

(22) Filed: Jul. 26, 2016

(30) Foreign Application Priority Data

Mar. 17, 2016 (KR) .................. 10-2016-0032405

(51) Int. Cl.
| | | |
|---|---|---|
| G11C 11/00 | (2006.01) | |
| G11C 7/22 | (2006.01) | |
| G11C 7/10 | (2006.01) | |
| G11C 8/10 | (2006.01) | |

(52) U.S. Cl.
CPC ............ *G11C 7/222* (2013.01); *G11C 7/106* (2013.01); *G11C 7/1057* (2013.01); *G11C 8/10* (2013.01)

(58) Field of Classification Search
CPC ......... G11C 8/48; G11C 7/222; G11C 21/005; G11C 29/842

USPC .................. 365/193, 191, 233.13
See application file for complete search history.

(56) References Cited

U.S. PATENT DOCUMENTS

| 2012/0014427 A1* | 1/2012 | Chang ................ H04L 27/0014 375/226 |
| 2014/0078840 A1* | 3/2014 | Seo ..................... G11C 29/022 365/194 |

FOREIGN PATENT DOCUMENTS

KR 1020150025887 A 3/2015

* cited by examiner

*Primary Examiner* — Han Yang
(74) *Attorney, Agent, or Firm* — William Park & Associates Ltd.

(57) ABSTRACT

A semiconductor device includes a division period signal generation circuit and a clock sampling circuit. The division period signal generation circuit generates a division period signal which is enabled in synchronization with a write period that is set according to a write command and latency information. The clock sampling circuit samples an internal strobe signal to output a sampling clock signal in response to the division period signal and the internal strobe signal during a sampling period. The sampling period is set to be longer than the write period.

20 Claims, 8 Drawing Sheets

US 9,672,884 B1

SEMICONDUCTOR DEVICES AND SEMICONDUCTOR SYSTEMS INCLUDING THE SAME

CROSS-REFERENCE TO RELATED APPLICATIONS

The present application claims priority under 35 U.S.C 119(a) to Korean Patent Application No. 10-2016-0032405, filed on Mar. 17, 2016, in the Korean Intellectual Property Office, which is incorporated herein by reference in its entirety.

BACKGROUND

1. Technical Field

Embodiments of the present disclosure relate to semiconductor devices and semiconductor systems including the same.

2. Related Art

Fast semiconductor memory devices with improved integration density are increasingly in demand. Synchronous memory devices operating in synchronization with external clock signals have been revealed to improve the operation speed thereof.

At first, single data rate (SDR) synchronous semiconductor memory devices have been proposed to improve the operation speed thereof. The SDR synchronous semiconductor memory devices may receive or output a single data through a single data pin in one cycle of the external clock signal in synchronization with every rising edge of the external clock signal. However, high performance devices operating at a higher speed than the SDR synchronous semiconductor memory devices have been demanded to meet the requirements of high performance semiconductor systems. Accordingly, double data rate (DDR) synchronous semiconductor memory devices have been recently proposed. DDR synchronous semiconductor memory devices may receive and output data in synchronization with every rising edge and every falling edge of an external clock signal. Thus, DDR synchronous semiconductor memory devices may operate at a speed which is at least twice higher than that of SDR synchronous semiconductor memory devices even without an increase in a frequency of the external clock signal.

SUMMARY

Various embodiments are directed to semiconductor devices generating a division strobe signal by dividing a data strobe signal and semiconductor systems including the same.

According to an embodiment, a semiconductor device may include a division period signal generation circuit and a clock sampling circuit. The division period signal generation circuit may generate a division period signal which may be enabled in synchronization with a write period that may be set according to a write command and latency information. The clock sampling circuit may sample an internal strobe signal to output a sampling clock signal in response to the division period signal and the internal strobe signal during a sampling period. The sampling period may be set to be longer than the write period.

According to another embodiment, a semiconductor device may include a division period signal generation circuit and a division circuit. The division period signal generation circuit may be configured to generate a division period signal which may be enabled in synchronization with a write period that is set according to a write command and latency information. The division circuit may divide a sampling clock signal in response to the division period signal to sequentially generate first to $N^{th}$ division strobe signals. The division period signal may be enabled in response to a write period signal enabled in the write period and an internal strobe signal. The division period signal may be disabled in response to the write period signal and any one of the first to $(N-1)^{th}$ division strobe signals.

According to yet another embodiment, a semiconductor system includes a first semiconductor device and a second semiconductor device. The first semiconductor device may be configured to output a command signal and a data strobe signal. The second semiconductor device may be configured to decode the command signal to generate a write command, configured to buffer the data strobe signal to generate an internal strobe signal, configured to generate a division period signal which is enabled in synchronization with a write period that is set according to the write command and latency information, and configured to sample the internal strobe signal to output a sampling clock signal in response to the division period signal and the internal strobe signal during a sampling period. The sampling period may be set to be longer than the write period.

BRIEF DESCRIPTION OF THE DRAWINGS

Various embodiments of the present disclosure will become more apparent in view of the attached drawings and accompanying detailed description, in which.

DETAILED DESCRIPTION OF THE EMBODIMENTS

Various embodiments of the present disclosure will be described hereinafter with reference to the accompanying drawings. However, the embodiments described herein are for illustrative purposes only and are not intended to limit the scope of the present disclosure.

Figure 1:
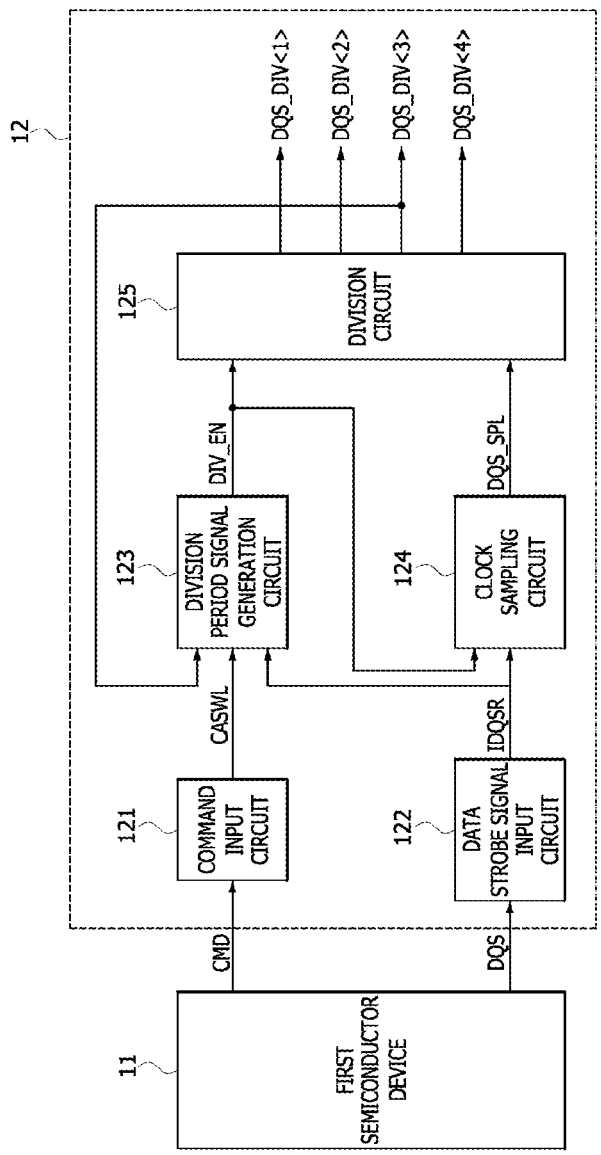
FIG. 1 is a block diagram illustrating a configuration of a semiconductor system according to an embodiment of the present disclosure.

As illustrated in FIG. 1, a semiconductor system according to an embodiment may include a first semiconductor device 11 and a second semiconductor device 12.

The first semiconductor device 11 may output a command signal CMD and a data strobe signal DQS. The command signal CMD may include a plurality of bits which may have any one of various logic level combinations. For example, the command signal CMD may have any logic level combination corresponding to an active operation, a read operation, a write operation, and a precharge operation of the second semiconductor device 12. The command signal CMD may be transmitted through lines that transmit only the command signal or through lines that simultaneously transmit the command signal CMD and an address signal (not illustrated). The data strobe signal DQS may be inputted to the second semiconductor device 12 when the write operation of the second semiconductor device 12 is performed.

The second semiconductor device 12 may include a command input circuit 121, a data strobe signal input circuit 122, a division period signal generation circuit 123, a clock sampling circuit 124, and a division circuit 125.

The command input circuit 121 may generate a write period signal CASWL in response to receiving the command signal CMD. If the command input circuit 121 decodes the command signal CMD to generate a write command (CMD_WT of FIG. 2), the command input circuit 121 may generate the write period signal CASWL which is enabled in a write period that is set according to the write command (CMD_WT of FIG. 2) and latency information. The latency information may include write latency and burst length information. The write latency may be set to a period from a time that the write command (CMD_WT of FIG. 2) is inputted till a time that write data are inputted. The burst length may correspond to the number of data which are continuously inputted during a write operation. The latency information may be stored in the command input circuit 121. In some embodiments, the latency information may be provided from an external device. The write period may start at a time earlier than when a write latency elapses, where the write latency elapses from a moment that the command signal CMD is decoded to generate the write command (CMD_WT of FIG. 2), by half a clock. The write period may terminate at a time which is earlier than when the write latency and the burst length period elapse, where the write latency and the burst length period elapse from a moment that the command signal CMD is decoded to generate the write command (CMD_WT of FIG. 2), by one clock. The term "half a clock" may correspond to a half cycle of the data strobe signal DQS, and the term "one clock" may correspond to one cycle of the data strobe signal DQS.

The data strobe signal input circuit 122 may buffer the data strobe signal DQS to generate an internal strobe signal IDQSR. The data strobe signal input circuit 122 may be realized using a general buffer circuit that buffers the data strobe signal DQS to generate the internal strobe signal IDQSR.

The division period signal generation circuit 123 may generate a division period signal DIV_EN in response to the write period signal CASWL, the internal strobe signal IDQSR, and a third division strobe signal DQS_DIV<3>. The division period signal generation circuit 123 may generate the division period signal DIV_EN which is enabled in synchronization with the write period signal CASWL that is enabled in the write period which is set according to the write command (CMD_WT of FIG. 2) and the latency information. The division period signal generation circuit 123 may generate the division period signal DIV_EN which is enabled in response to the write period signal CASWL and the internal strobe signal IDQSR. The division period signal generation circuit 123 may generate the division period signal DIV_EN which is enabled if the write period signal CASWL is enabled and the internal strobe signal IDQSR has a logic low level. The division period signal generation circuit 123 may generate the division period signal DIV_EN which is disabled in response to the write period signal CASWL and the third division strobe signal DQS_DIV<3>. The division period signal generation circuit 123 may generate the division period signal DIV_EN which is disabled if the write period signal CASWL is disabled and the third division strobe signal DQS_DIV<3> has a logic high level. In some embodiments, the division period signal generation circuit 123 may generate the division period signal DIV_EN which is disabled in response to the write period signal CASWL and any one of first to (N−1)$^{th}$ division strobe signals DQS, for example any one of the first to third division strobe signals DQS_DIV<1:3>.

The clock sampling circuit 124 may sample the internal strobe signal IDQSR to output a sampling clock signal DQS_SPL in response to the division period signal DIV_EN and the internal strobe signal IDQSR during a sampling period. The sampling period may be set to have a period which is longer than the write period and an enablement period of the division period signal DIV_EN. The sampling period may be set from a time that the division period signal DIV_EN is enabled to have a logic high level till a time that the internal strobe signal IDQSR has a logic low level after the division period signal DIV_EN is disabled. That is, the clock sampling circuit 124 may sample the internal strobe signal IDQSR to output the sampling clock signal DQS_SPL from a time that the division period signal DIV_EN is enabled to have a logic high level till a time that the internal strobe signal IDQSR has a logic low level after the division period signal DIV_EN is disabled.

The division circuit 125 may divide the sampling clock signal DQS_SPL to sequentially generate first to fourth division strobe signals DQS_DIV<1:4> in response to the division period signal DIV_EN. The first to fourth division strobe signals DQS_DIV<1:4> may be generated to have different phases from each other. The first to fourth division strobe signals DQS_DIV<1:4> may be generated to have a cycle time which is twice that of the sampling clock signal DQS_SPL. In some embodiments, the division circuit 125 may divide the sampling clock signal DQS_SPL in response to the division period signal DIV_EN to generate first to N$^{th}$ division strobe signals DQS_DIV<1:N>.

Figure 2:
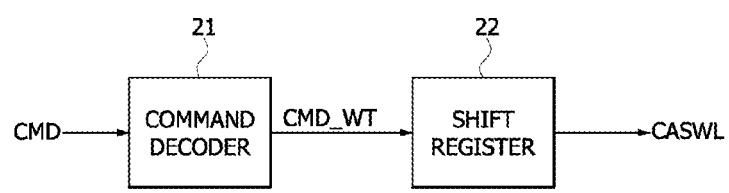
FIG. 2 is a block diagram of a command input circuit included in the semiconductor system of FIG. 1.

Referring to FIG. 2, the command input circuit 121 may include a command decoder 21 and a shift register 22.

The command decoder 21 may decode the command signal CMD to generate the write command CMD_WT. If the write operation of the second semiconductor device 12 is performed, the command decoder 21 may decode the command signal CMD to generate the write command CMD_WT. If the write operation of the second semiconductor device 12 is performed, the command signal CMD may have a logic level combination corresponding to the write command CMD_WT.

The shift register 22 may generate the write period signal CASWL which is enabled in the write period which is set according to the write command CMD_WT and the latency information. The latency information may include the write latency and the burst length information. The latency information may be stored in the shift register 22. The write period may start at a time earlier than when the write latency elapses, where the write latency elapses from a moment that the write command CMD_WT is generated, by half a clock. The write period may terminate at a time which is earlier than a when the write latency and the burst length period elapse, where the write latency and the burst length period elapse from a moment that the write command CMD_WT is generated, by one clock. The term "half a clock" may correspond to a half cycle of the data strobe signal DQS, and the term "one clock" may correspond to one cycle of the data strobe signal DQS.

Figure 3:
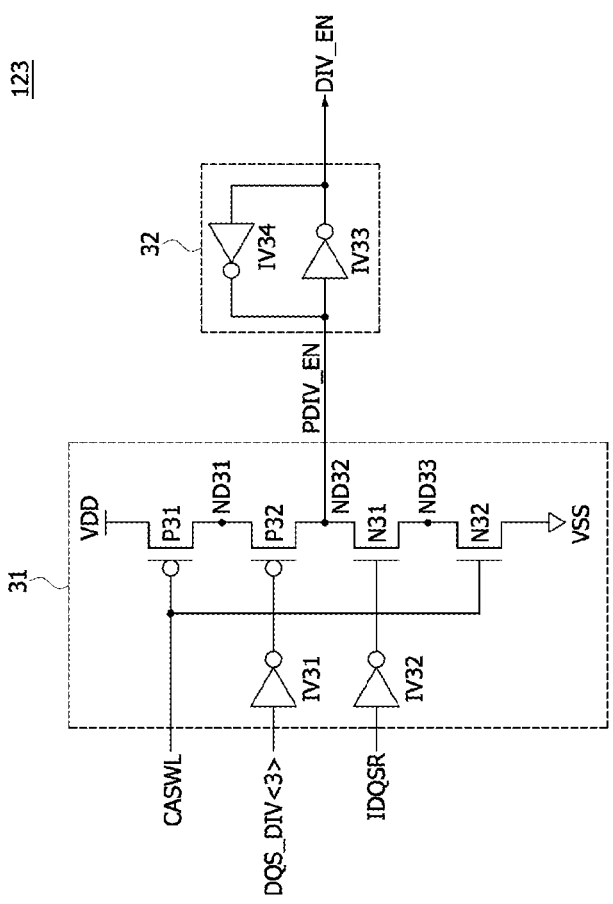
FIG. 3 is a circuit diagram illustrating a division period signal generation circuit included in the semiconductor system of FIG. 1.

Referring to FIG. 3, the division period signal generation circuit 123 may include a division period control circuit 31 and a latch circuit 32.

The division period control circuit 31 may include inverters IV31 and IV32, PMOS transistors P31 and P32, and NMOS transistors N31 and N32.

The inverter IV31 may inversely buffer the third division strobe signal DQS_DIV<3> and may output a complementary signal of the buffered third division strobe signal DQS_DIV<3>. The inverter IV32 may inversely buffer the internal strobe signal IDQSR and may output a complementary signal of the buffered internal strobe signal IDQSR. The PMOS transistor P31 may be connected between a power supply voltage VDD terminal and a node ND31 and may be turned on in response to receiving the write period signal CASWL. The PMOS transistor P32 may be connected between the node ND31 and a node ND32 through which a pre-division period signal PDIV_EN is outputted, and PMOS transistor P32 may be turned on in response to receiving an output signal of the inverter IV31. The NMOS transistor N31 may be connected between the node ND32 and a node ND33, and the NMOS transistor N31 may be turned on in response to receiving an output signal of the inverter IV32. The NMOS transistor N32 may be connected between the node ND33 and a ground voltage VSS terminal, and the NMOS transistor N32 may be turned on in response to receiving the write period signal CASWL.

The latch circuit 32 may include inverters IV33 and IV34. The inverter IV33 may inversely buffer the pre-division period signal PDIV_EN to output a complementary signal of the buffered pre-division period signal PDIV_EN as the division period signal DIV_EN. The inverter IV34 may inversely buffer the division period signal DIV_EN to output a complementary signal of the buffered division period signal DIV_EN as the pre-division period signal PDIV_EN.

That is, the division period control circuit 31 may generate the pre-division period signal PDIV_EN in response to at least one of the write period signal CASWL, the internal strobe signal IDQSR, and to any one of the first to (N−1)$^{th}$ division strobe signals, for example the third division strobe signal DQS_DIV<3>. In the division period control circuit 31, if the write period signal CASWL is enabled to have a logic high level and the internal strobe signal IDQSR has a logic low level, the NMOS transistors N31 and N32 may be turned on to generate the pre-division period signal PDIV_EN having a logic low level. Thus, the latch circuit 32 may inversely buffer the pre-division period signal PDIV_EN to generate the division period signal DIV_EN which is enabled to have a logic high level, and the latch circuit 32 may latch the inversely buffered division period signal DIV_EN. In the division period control circuit 31, if the write period signal CASWL is disabled to have a logic low level and the third division strobe signal DQS_DIV<3> has a logic high level, the PMOS transistors P31 and P32 may be turned on to generate the pre-division period signal PDIV_EN having a logic high level. Thus, the latch circuit 32 may inversely buffer the pre-division period signal PDIV_EN to generate the division period signal DIV_EN which is disabled to have a logic low level, and the latch circuit 32 may latch the inversely buffered division period signal DIV_EN.

Figure 4:
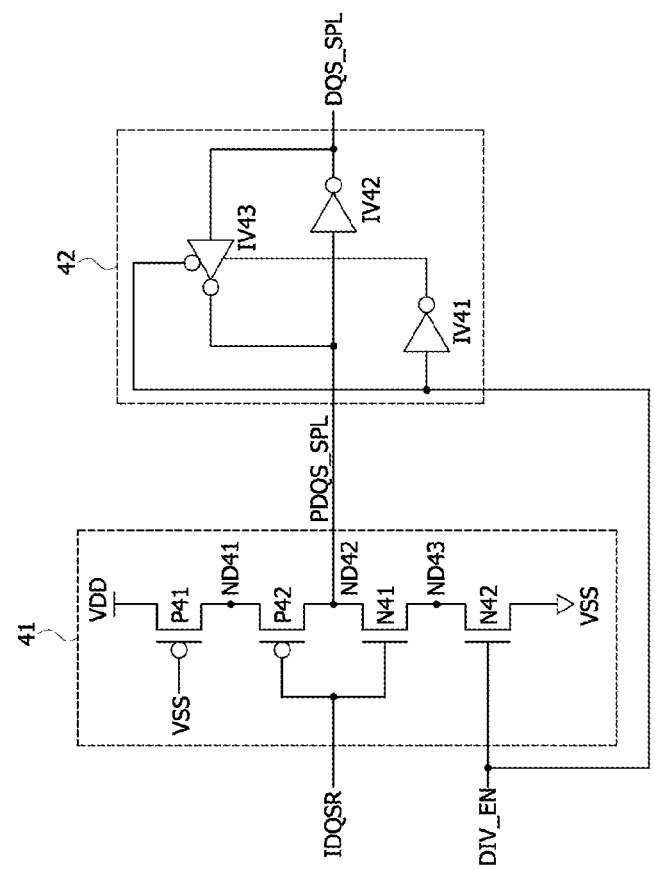
FIG. 4 is a circuit diagram of a clock sampling circuit included in the semiconductor system of FIG. 1.

Referring to FIG. 4, the clock sampling circuit 124 may include a buffer circuit 41 and a sampling clock signal output circuit 42.

The buffer circuit 41 may include PMOS transistors P41 and P42, and NMOS transistors N41 and N42. The PMOS transistor P41 may be connected between the power supply voltage VDD terminal and a node ND41, and the PMOS transistor P41 may be turned on in response to receiving the ground voltage VSS. The PMOS transistor P42 may be connected between the node ND41 and a node ND42 through which a pre-sampling clock signal PDQS_SPL is outputted, and the PMOS transistor P42 may be turned on in response to receiving the internal strobe signal IDQSR. The NMOS transistor N41 may be connected between the node ND42 and a node ND43, and the NMOS transistor N41 may be turned on in response receiving to the internal strobe signal IDQSR. The NMOS transistor N42 may be connected between the node ND43 and the ground voltage VSS terminal, and the NMOS transistor N42 may be turned on in response to receiving the division period signal DIV_EN.

The sampling clock signal output circuit 42 may include inverters IV41, IV42, and IV43. The inverter IV41 may inversely buffer the division period signal DIV_EN and may output a complementary signal of the buffered division period signal DIV_EN. The inverter IV42 may inversely buffer the pre-sampling clock signal PDQS_SPL and may output a complementary signal of the buffered pre-sampling clock signal PDQS_SPL. If the division period signal DIV_EN is disabled to have a logic low level, the inverter IV43 may inversely buffer the sampling clock signal DQS_SPL and may output a complementary signal of the buffered sampling clock signal DQS_SPL as the pre-sampling clock signal PDQS_SPL.

That is, the buffer circuit 41 may inversely buffer the internal strobe signal IDQSR to generate the pre-sampling clock signal PDQS_SPL in response to the division period signal DIV_EN being, for example, disabled and the internal strobe signal IDQSR having, for example, a logic high level. If the division period signal DIV_EN is enabled to have a logic high level, the buffer circuit 41 may inversely buffer the internal strobe signal IDQSR to output a complementary signal of the buffered internal strobe signal IDQSR as the pre-sampling clock signal PDQS_SPL. The sampling clock signal output circuit 42 may inversely buffer the pre-sampling clock signal PDQS_SPL to output a complementary signal of the buffered pre-sampling clock signal PDQS_SPL as the sampling clock signal DQS_SPL. Accordingly, the clock sampling circuit 124 may sample the internal strobe signal IDQSR to output the sampled signal as the sampling clock signal DQS_SPL during a period that the division period signal DIV_EN is enabled to have a logic high level. If the division period signal DIV_EN is disabled to have a logic low level, the buffer circuit 41 may stop an operation of driving the pre-sampling clock signal PDQS_SPL to a logic low level and the sampling clock signal output circuit 42 may latch the sampling clock signal DQS_SPL. In such a case, the clock sampling circuit 124 may maintain the sampling clock signal DQS_SPL having a logic high level till a level of the internal strobe signal IDQSR changes from a logic high level into a logic low level. If a level of the internal strobe signal IDQSR changes from a logic high level to a logic low level, the buffer circuit 41 may drive the pre-sampling clock signal PDQS_SPL to a logic high level and the sampling clock signal output circuit 42 may inversely buffer the pre-sampling clock signal PDQS_SPL to generate the sampling clock signal DQS_SPL having a logic low level.

Figure 5:
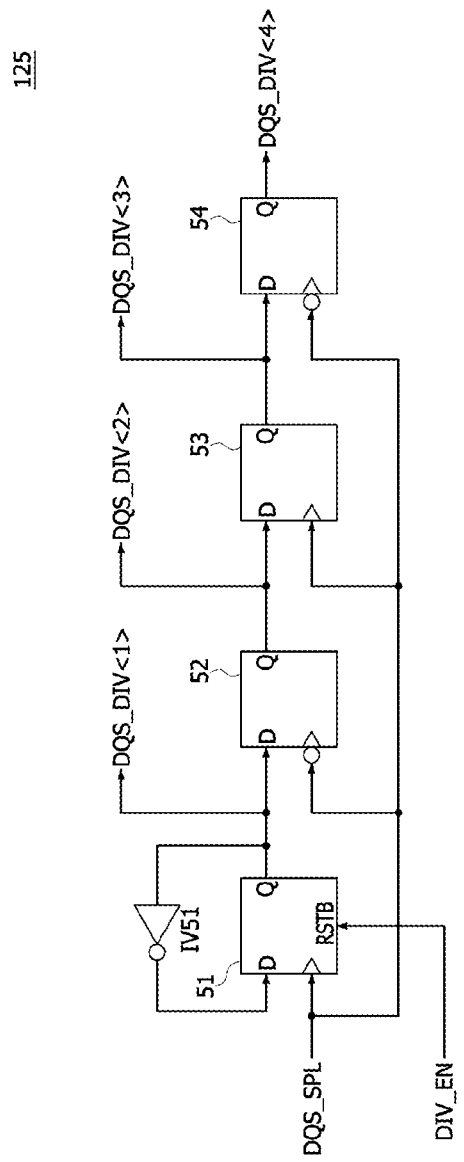
FIG. 5 is a circuit diagram illustrating a division circuit included in the semiconductor system of FIG. 1.

Referring to FIG. 5, the division circuit 125 may include an inverter IV51, a first latch 51, a second latch 52, a third latch 53, and a fourth latch 54.

The inverter IV51 may inversely buffer the first division strobe signal DQS_DIV<1> to output a complementary signal of the buffered first division strobe signal DQS_DIV<1>.

The first latch 51 may latch a signal which is generated by inversely buffering the first division strobe signal DQS_DIV<1> and may output the latched signal as the first division strobe signal DQS_DIV<1> in response to the division period signal DIV_EN and the sampling clock signal DQS_SPL. If the division period signal DIV_EN is enabled to have a logic high level, the first latch 51 may latch an inversely buffered signal of the first division strobe signal DQS_DIV<1> and may output the latched signal as the first division strobe signal DQS_DIV<1> in synchronization with a rising edge of the sampling clock signal DQS_SPL. If the division period signal DIV_EN is disabled to have a logic low level, the first latch 51 may output the first division strobe signal DQS_DIV<1> having a logic low level.

The second latch 52 may latch the first division strobe signal DQS_DIV<1> to generate the second division strobe signal DQS_DIV<2> in response to the sampling clock signal DQS_SPL. The second latch 52 may latch the first division strobe signal DQS_DIV<1> to generate the second division strobe signal DQS_DIV<2> in synchronization with a falling edge of the sampling clock signal DQS_SPL.

The third latch 53 may latch the second division strobe signal DQS_DIV<2> to generate the third division strobe signal DQS_DIV<3> in response to the sampling clock signal DQS_SPL.

The third latch 53 may latch the second division strobe signal DQS_DIV<2> to generate the third division strobe signal DQS_DIV<3> in synchronization with a rising edge of the sampling clock signal DQS_SPL.

The fourth latch 54 may latch the third division strobe signal DQS_DIV<3> to generate a fourth division strobe signal DQS_DIV<4> in response to the sampling clock signal DQS_SPL.

The fourth latch 54 lay latch the third division strobe signal DQS_DIV<3> to generate the fourth division strobe signal DQS_DIV<4> in synchronization with a falling edge of the sampling clock signal DQS_SPL.

Figure 6:
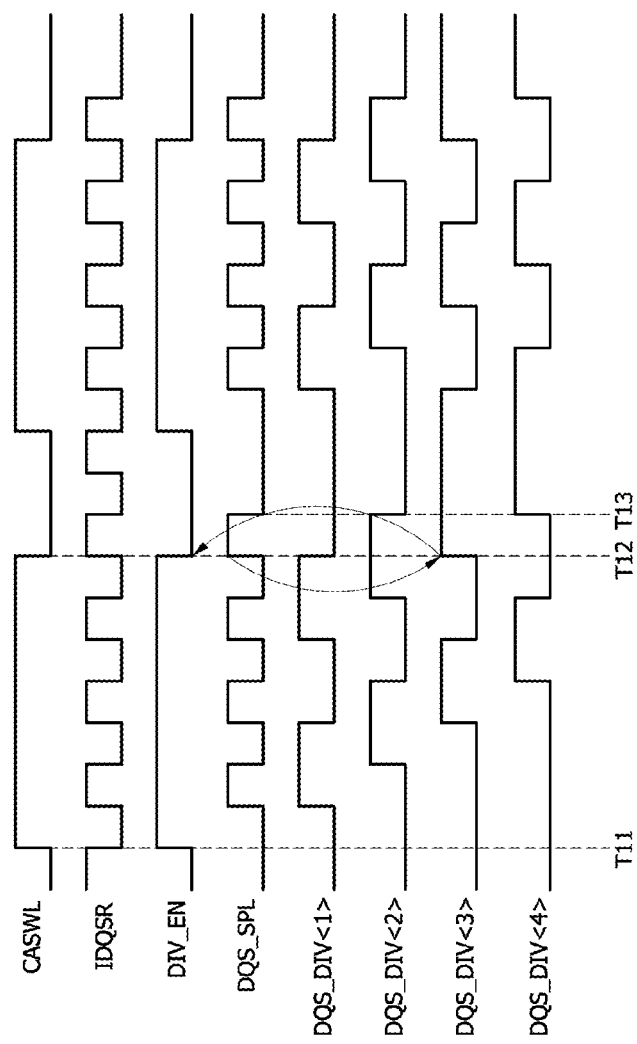
FIG. 6 and FIG. 7 are timing diagrams illustrating operations of the semiconductor system shown in FIG. 1 to FIG. 5.

An operation of the semiconductor system shown in FIG. 1 to FIG. 5 will be described hereinafter with reference to FIG. 6 in conjunction with an example in which the burst length is "8".

First, the write period signal CASWL may be enabled in response to the command signal CMD during a period (corresponding to a write operation period) from a time T11 till a time T12. The division period signal DIV_EN may be enabled to a logic high level at the time T11 that the write period signal CASWL is enabled to have a logic high level and the internal strobe signal IDQSR has a logic low level. While the division period signal DIV_EN is enabled to a logic high level, the sampling clock signal DQS_SPL may be generated by sampling the internal strobe signal IDQSR. The first to fourth division strobe signals DQS_DIV<1:4> may be sequentially generated by dividing the sampling clock signal DQS_SPL. At the time T12, the write period signal CASWL may be disabled to a logic low level, and a level of the third division strobe signal DQS_DIV<3> may change into a logic high level from a logic low level in synchronization with a rising edge of the sampling clock signal DQS_SPL. At the time T12, the division period signal DIV_EN may be disabled to a logic low level in response to the write period signal CASWL disabled to a logic low level and the third division strobe signal DQS_DIV<3> having a logic high level. At the time T12, the sampling clock signal DQS_SPL may be continuously generated by sampling the internal strobe signal IDQSR, if the internal strobe signal IDQSR has a logic high level while the division period signal DIV_EN is disabled to have a logic low level. At a time T13, if a level of the internal strobe signal IDQSR changes from a logic high level into a logic low level, a level of the sampling clock signal DQS_SPL may change from a logic high level into a logic low level and an operation of generating the sampling clock signal DQS_SPL by sampling the internal strobe signal IDQSR may terminate. Accordingly, the sampling clock signal DQS_SPL may be generated by sampling the internal strobe signal IDQSR during a sampling period from the time T11 that the division period signal DIV_EN is enabled to have a logic high level till the time T12 that the division period signal DIV_EN is disabled to have a logic low level and the internal strobe signal IDQSR has a logic low level.

Figure 7:
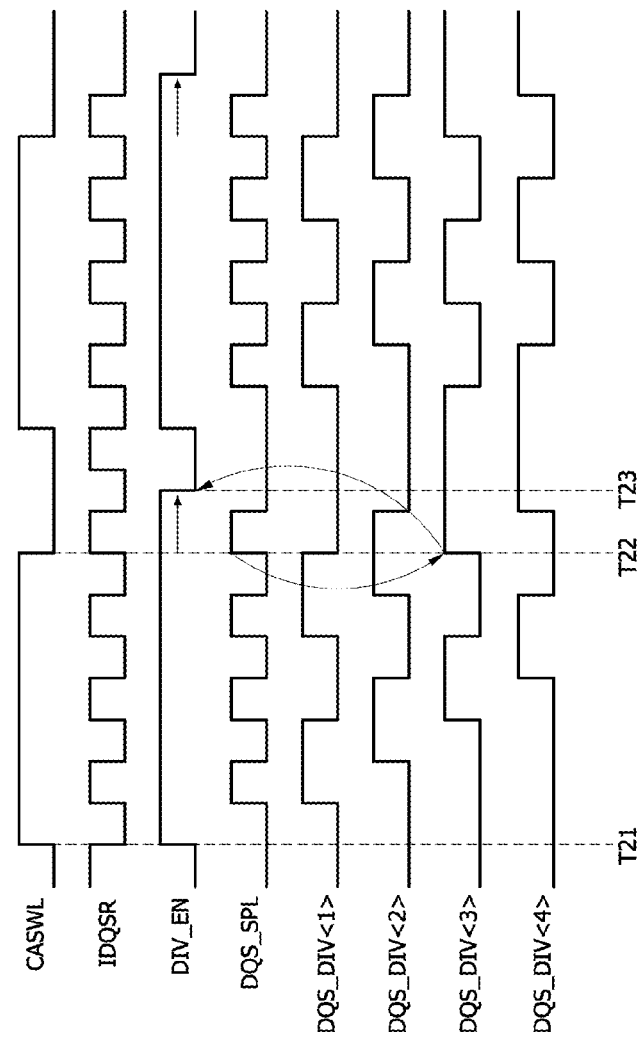

In the semiconductor system shown in FIGS. 1 to 5, an example in which a disabled moment of the division period signal DIV_EN is delayed in a low power supply voltage VDD mode or in a high speed operation mode will be described hereinafter with reference to FIG. 7.

First, the write period signal CASWL may be enabled in response to the command signal CMD during a period from a time T21 till a time T22. The division period signal DIV_EN may be enabled to a logic high level at the time T21 that the write period signal CASWL is enabled to have a logic high level and the internal strobe signal IDQSR has a logic low level. If the division period signal DIV_EN is enabled to a logic high level, the sampling clock signal DQS_SPL may be generated by sampling the internal strobe signal IDQSR. The first to fourth division strobe signals DQS_DIV<1:4> may be sequentially generated by dividing the sampling clock signal DQS_SPL. At the time T22, the write period signal CASWL may be disabled to a logic low level and a level of the third division strobe signal DQS_DIV<3> may change into a logic high level from a logic low level in synchronization with a rising edge of the sampling clock signal DQS_SPL. At the time T22, a disabled moment of the division period signal DIV_EN may be delayed from the time T22 to a time T23 in response to the write period signal CASWL disabled to a logic low level and the sampling clock signal DQS_SPL changing from a logic low level to a logic high level. That is, the division period signal DIV_EN may be disabled to a logic low level at the time T23. At the time T23, a sampling operation of the sampling clock signal DQS_SPL may terminate, if the division period signal DIV_EN is disabled to a logic low level while the internal strobe signal IDQSR has a logic low level.

As described above, the division period signal DIV_EN may be disabled before termination of the operation for generating the sampling clock signal DQS_SPL by sampling the internal strobe signal IDQSR. Accordingly, it is possible to prevent a malfunction which is due to an erroneous generation of the sampling clock signal DQS_SPL for generating the first to fourth division strobe signals DQS_DIV<1:4> in the event that a disabled moment of the division period signal DIV_EN is delayed.

Figure 8:
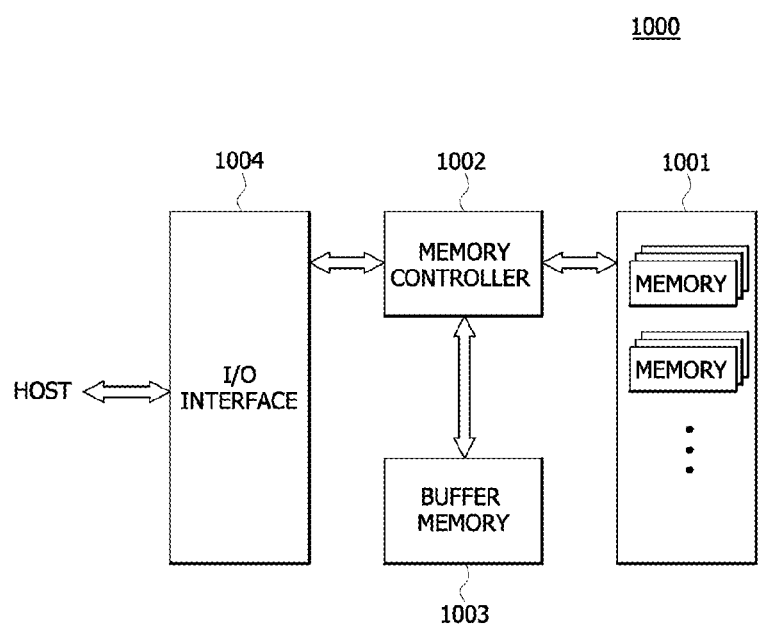
FIG. 8 is a block diagram illustrating a configuration of an electronic system employing the semiconductor system shown in FIG. 1 to FIG. 7.

The second semiconductor device or the semiconductor system described with reference to FIGS. 1 to 7 may be applied to an electronic system that includes a memory system, a graphic system, a computing system, a mobile system, or the like. For example, as illustrated in FIG. 8, an electronic system 1000 according an embodiment may include a data storage circuit 1001, a memory controller 1002, a buffer memory 1003, and an input/output (I/O) interface 1004.

The data storage circuit 1001 may store data which are outputted from the memory controller 1002 or may read and output the stored data to the memory controller 1002, according to a control signal generated from the memory controller 1002. The data storage circuit 1001 may include the second semiconductor device 12 illustrated in FIG. 1. Meanwhile, the data storage circuit 1001 may include a nonvolatile memory that can retain their stored data even when its power supply is interrupted. The nonvolatile memory may be a flash memory such as a NOR-type flash memory or a NAND-type flash memory, a phase change random access memory (PRAM), a resistive random access memory (RRAM), a spin transfer torque random access memory (STTRAM), a magnetic random access memory (MRAM), or the like.

The memory controller 1002 may receive a command outputted from an external device (e.g., a host device) through the I/O interface 1004 and may decode the command outputted from the host device to control an operation for inputting data into the data storage circuit 1001 or the buffer memory 1003 or for outputting the data stored in the data storage circuit 1001 or the buffer memory 1003. The memory controller 1002 may include the first semiconductor device 11 illustrated in FIG. 1. Although FIG. 8 illustrates the memory controller 1002 with a single block, the memory controller 1002 may include one controller for controlling the data storage circuit 1001 and another controller for controlling the buffer memory 1003 comprised of a volatile memory.

The buffer memory 1003 may temporarily store data which are processed by the memory controller 1002. That is, the buffer memory 1003 may temporarily store data which are outputted from or inputted to the data storage circuit 1001. The buffer memory 1003 may store the data, which are outputted from the memory controller 1002, according to a control signal. The buffer memory 1003 may read and output the stored data to the memory controller 1002. The buffer memory 1003 may include a volatile memory such as a dynamic random access memory (DRAM), a mobile DRAM, or a static random access memory (SRAM).

The I/O interface 1004 may physically and electrically connect the memory controller 1002 to the external device (i.e., the host). Thus, the memory controller 1002 may receive control signals and data supplied from the external device (i.e., the host) through the I/O interface 1004 and may output the data generated from the memory controller 1002 to the external device (i.e., the host) through the I/O interface 1004. That is, the electronic system 1000 may communicate with the host through the I/O interface 1004. The I/O interface 1004 may include any one of various interface protocols such as a universal serial bus (USB), a multimedia card (MMC), a peripheral component interconnect-express (PCI-E), a serial attached SCSI (SAS), a serial AT attachment (SATA), a parallel AT attachment (PATA), a small computer system interface (SCSI), an enhanced small device interface (ESDI), and an integrated drive electronics (IDE).

The electronic system 1000 may be used as an auxiliary storage device of the host or an external storage device. The electronic system 1000 may include a solid state disk (SSD), a USB memory, a secure digital (SD) card, a mini secure digital (mSD) card, a micro secure digital (micro SD) card, a secure digital high capacity (SDHC) card, a memory stick card, a smart media (SM) card, a multi-media card (MMC), an embedded multi-media card (eMMC), a compact flash (CF) card, or the like.

According to the embodiments, it is possible to generate a stable division strobe signal, even if a moment of disablement of a division period signal is delayed by disabling the division period signal in advance of a time that a sampling period in which a sampling clock signal is generated terminates.

In addition, according to the embodiments, it is possible to generate a stable sampling clock signal, even if the division period signal is disabled in advance of a time that the sampling period in which the sampling clock signal is generated terminates.

What is claimed is:
1. A semiconductor device comprising:
    a division period signal generation circuit configured to generate a division period signal which is enabled in synchronization with a write period that is set according to a write command and latency information; and
    a clock sampling circuit configured to sample an internal strobe signal to output a sampling clock signal in response to the division period signal and the internal strobe signal during a sampling period,
    wherein the sampling period is set to be longer than the write period.
2. The device of claim 1, wherein the latency information includes write latency and burst length information.
3. The device of claim 1, wherein the division period signal is generated in response to a write period signal, the internal strobe signal, and a division strobe signal.
4. The device of claim 3, wherein the division period signal is enabled if the write period signal is enabled and the internal strobe signal has a first logic level.
5. The device of claim 3, wherein the division period signal is disabled if the write period signal is disabled and the division strobe signal has a second logic level.
6. The device of claim 3, wherein the division strobe signal is generated by dividing the sampling clock signal.
7. The device of claim 1, wherein the sampling period is set from a time that the division period signal is enabled till a time that the internal strobe signal has a first logic level after the division period signal is disabled.
8. The device of claim 1, wherein the division period signal generation circuit includes:
    a division period control circuit configured to generate a pre-division period signal in response to a write period signal, the internal strobe signal, and a division strobe signal; and
    a latch circuit configured to inversely buffer the pre-division period signal to generate the division period signal and configured to latch the inversely buffered pre-division period signal.
9. The device of claim 1, wherein the clock sampling circuit includes:
    a buffer circuit configured to inversely buffer the internal strobe signal to generate a pre-sampling clock signal, in response to the division period signal; and
    a sampling clock signal output circuit configured to inversely buffer the pre-sampling clock signal to generate the sampling clock signal.
10. The device of claim 9, wherein the buffer circuit inversely buffers the internal strobe signal to generate the pre-sampling clock signal, if the internal strobe signal has a first logic level while the division period signal is disabled.

11. The device of claim 9, wherein the sampling clock signal output circuit latches the sampling clock signal, if the division period signal is disabled.

12. The device of claim 1, further comprising a division circuit configured to divide the sampling clock signal to sequentially generate first to fourth division strobe signals.

13. The device of claim 12, wherein the division period signal is disabled, if a write period signal is disabled and the third division strobe signal has a first logic level.

14. A semiconductor device comprising:
a division period signal generation circuit configured to generate a division period signal which is enabled in synchronization with a write period that is set according to a write command and latency information; and
a division circuit configured to divide a sampling clock signal in response to the division period signal to sequentially generate first to $N^{th}$ division strobe signals,
wherein the division period signal is enabled in response to a write period signal enabled in the write period and an internal strobe signal, and
wherein the division period signal is disabled in response to the write period signal and any one of the first to $(N-1)^{th}$ division strobe signals.

15. The device of claim 14, wherein the division period signal is enabled, if the write period signal is enabled and the internal strobe signal has a first logic level.

16. The device of claim 14, wherein the division period signal is disabled, if the write period signal is disabled and the division strobe signal has a second logic level.

17. The device of claim 14, wherein the sampling clock signal is generated by sampling the internal strobe signal in response to the division period signal and the internal strobe signal during a sampling period.

18. The device of claim 17, wherein the sampling period is set from a time that the division period signal is enabled till a time that the internal strobe signal has a first logic level after the division period signal is disabled.

19. The device of claim 14, wherein the division period signal generation circuit includes:
a division period control circuit configured to generate a pre-division period signal in response to any one of the first to $(N-1)^{th}$ division strobe signals, a write period signal, and the internal strobe signal; and
a latch circuit configured to inversely buffer the pre-division period signal to generate the division period signal and configured to latch the inversely buffered pre-division period signal.

20. A semiconductor system comprising:
a first semiconductor device configured to output a command signal and a data strobe signal; and
a second semiconductor device configured to decode the command signal to generate a write command, configured to buffer the data strobe signal to generate an internal strobe signal, configured to generate a division period signal which is enabled in synchronization with a write period that is set according to the write command and latency information, and configured to sample the internal strobe signal to output a sampling clock signal in response to the division period signal and the internal strobe signal during a sampling period,
wherein the sampling period is set to be longer than the write period.

* * * * *